United States Patent
Varnica et al.

(10) Patent No.: US 11,381,252 B1
(45) Date of Patent: Jul. 5, 2022

(54) METHODS AND SYSTEMS FOR SHORT ERROR EVENT CORRECTION IN STORAGE CHANNEL APPLICATIONS

(71) Applicant: Marvell Asia Pte, Ltd., Singapore (SG)

(72) Inventors: Nedeljko Varnica, San Jose, CA (US); Mats Oberg, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/161,311

(22) Filed: Jan. 28, 2021

Related U.S. Application Data

(60) Provisional application No. 62/966,899, filed on Jan. 28, 2020.

(51) Int. Cl.
    *H03M 13/11*     (2006.01)
    *H03M 13/09*     (2006.01)
    *H03M 13/27*     (2006.01)

(52) U.S. Cl.
    CPC ..... *H03M 13/1108* (2013.01); *H03M 13/098* (2013.01); *H03M 13/271* (2013.01)

(58) Field of Classification Search
    CPC ........... H03M 13/1108; H03M 13/098; H03M 13/271
See application file for complete search history.

(56) References Cited

U.S. PATENT DOCUMENTS

| | | | |
|---|---|---|---|
| 6,272,659 B1 * | 8/2001 | Zook ................ | H03M 13/1515 714/763 |
| 10,587,288 B1 * | 3/2020 | Chilappagari ...... | G06F 11/1068 |
| 2002/0049947 A1 * | 4/2002 | Sridharan ......... | H03M 13/2909 714/752 |
| 2002/0116681 A1 * | 8/2002 | Amrani ................ | H03M 13/29 714/792 |
| 2004/0117711 A1 * | 6/2004 | Farbert ............ | H03M 13/2717 714/755 |
| 2013/0268822 A1 * | 10/2013 | Manoochehri ...... | G06F 11/1064 714/758 |
| 2015/0074500 A1 * | 3/2015 | Farhoodfar ....... | H03M 13/2782 714/776 |
| 2017/0093436 A1 * | 3/2017 | Farhoodfar ....... | H03M 13/2707 |

* cited by examiner

*Primary Examiner* — Thien Nguyen

(57) ABSTRACT

A method for decoding a codeword includes partitioning the codeword into a plurality of component codewords where each of the component codewords comprising a respective plurality of bits. The respective plurality of bits in each of the plurality of component codewords are interleaved. Each of the plurality of interleaved component codewords are decoded along two dimensions to produce (i) a set of first decoding results and (ii) a set of second decoding results. A short error event is then detected and corrected based on (i) the set of first decoding results and (ii) the set of second decoding results.

20 Claims, 9 Drawing Sheets

METHODS AND SYSTEMS FOR SHORT ERROR EVENT CORRECTION IN STORAGE CHANNEL APPLICATIONS

CROSS REFERENCE TO RELATED APPLICATIONS

This disclosure claims the benefit of commonly-assigned U.S. Provisional Patent Application No. 62/966,899, filed Jan. 28, 2020, which is hereby incorporated by reference herein in its entirety.

FIELD OF USE

This disclosure relates generally to Error Correcting Coding. More particularly, this disclosure relates to short error event correction by interleaving bits of a component codewords.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Embodiments of this invention generally pertain to systems and methods for encoding and decoding user data for communication and/or storage applications to enhance error detection and correction of the data.

Defects in a storage media, or errors in the reading and writing of data from a storage media, may result in data errors. Similarly, transmission of data through a transmission channel may result in errors, because of noise in the transmission channel. However, digital communication and storage systems need to perform accurately and reliably in the presence of these defects and errors. One typical Error Correction Code (ECC) used in storage application is a low-density parity check (LDPC) code. However, LDPC codes are susceptible to particular error events that are short that may be difficult to discern (as described in greater detail below). In storage applications, having solutions that effectively deal with short error events from an ECC decoder are critical.

SUMMARY

Implementations according to the subject matter of this disclosure include a method for decoding a codeword. The codeword is partitioned into a plurality of component codewords where each of the component codewords comprising a respective plurality of bits. The respective plurality of bits in each of the plurality of component codewords are interleaved. Each of the plurality of interleaved component codewords are then decoded along two dimensions to produce (i) a set of first decoding results and (ii) a set of second decoding results. A short error event is detected and then corrected in the decoded interleaved component codewords based on (i) the set of first decoding results and (ii) the set of second decoding results.

In a first implementation of such a method, the plurality of component codewords form an array comprising (i) M row codewords and (ii) N column codewords where M and N are integers greater than 0. Decoding each of the plurality of interleaved component codewords along two dimensions includes decoding each of the M row codewords to produce the set of first decoding results corresponding to each of the M rows of the array, and decoding each of the N column codewords to produce the set of second decoding results corresponding to each of the N columns of the array.

In one implementation of the method for decoding the codeword, detecting the short error event in the decoded interleaved component codewords based on (i) the set of first decoding results and (ii) the set of second decoding results includes determining whether at least one row codeword of the M row codewords has a non-zero syndrome weight based on the corresponding first decoding result. In response to determining that at least one row codeword of the M row codewords has a non-zero syndrome weight based on the corresponding first decoding result, a near-codeword error event is detected as the short error event in the decoded interleaved component codewords.

In an implementation, the detected near-codeword error event is corrected based on (i) the set of first decoding results and (ii) the set of second decoding results by identifying, based on the corresponding second decoding result, at least one column codeword of the N column codewords having a non-zero syndrome weight and identifying, based on the at least one column codeword having the non-zero syndrome weight, at least one bit location in the at least one row codeword having the non-zero syndrome weight. A bit located at the at least one identified bit location in the array is flipped and the at least one row codeword with the flipped bit is decoded again.

In one implementation, the short error event in the decoded interleaved component codewords is detected based on (i) the set of first decoding results and (ii) the set of second decoding results by determining, based on the corresponding first decoding result, whether at least one row codeword of the M row codewords has a non-zero syndrome weight. In response to determining that none of the M row codewords have a non-zero syndrome weight based on the corresponding first decoding result, a determination is made, based on the corresponding second decoding result, whether at least one column codeword of the N column codewords has a non-zero syndrome weight. If at least one column codeword of the N column codewords has a non-zero syndrome weight based on the corresponding second decoding result, a mis-correction error event is detected as the short error event in the decoded interleaved component codewords.

In one implementation, correcting the detected mis-correction error event based on (i) the set of first decoding results and (ii) the set of second decoding results includes identifying, based on the corresponding second decoding result, at least one column codeword of the N column codewords having a non-zero syndrome weight. A bit within each of the M row codewords is flipped at a location corresponding to the identified at least one column codeword. The M row codewords including the flipped bit are then iteratively decoded.

An implementation of the method further includes determining whether at least one row codeword of the M row codewords including the flipped bit produces a non-zero syndrome weight. In response to determining that at least one row codeword of the row codeword of the M row codewords including the flipped bit produces a non-zero syndrome weight, the flipped bit is re-flipped and the row codeword is re-decoded.

In one implementation, the N column codewords including the flipped bit are re-decoded.

In one implementation, a cyclic redundancy check is performed on the plurality of component codewords with the corrected short error event.

In one implementation, the N column codewords are of an interleaved single parity check (SPC) code and the M row codewords are of an interleaved low-density parity check (LDPC) code.

Implementations according to the subject matter of the disclosure of an apparatus for decoding a codeword include and interleaver and a decoder. The interleaver is configured to partition the codeword into a plurality of component codewords, each of the component codewords comprising a respective plurality of bits, and interleave the respective plurality of bits in each of the plurality of component codewords. The decoder is configured to decode each of the plurality of interleaved component codewords along two dimensions to produce (i) a set of first decoding results and (ii) a set of second decoding results, detect a short error event in the decoded interleaved component codewords based on (i) the set of first decoding results and (ii) the set of second decoding results, and correct the detected short error event based on (i) the set of first decoding results and (ii) the set of second decoding results.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
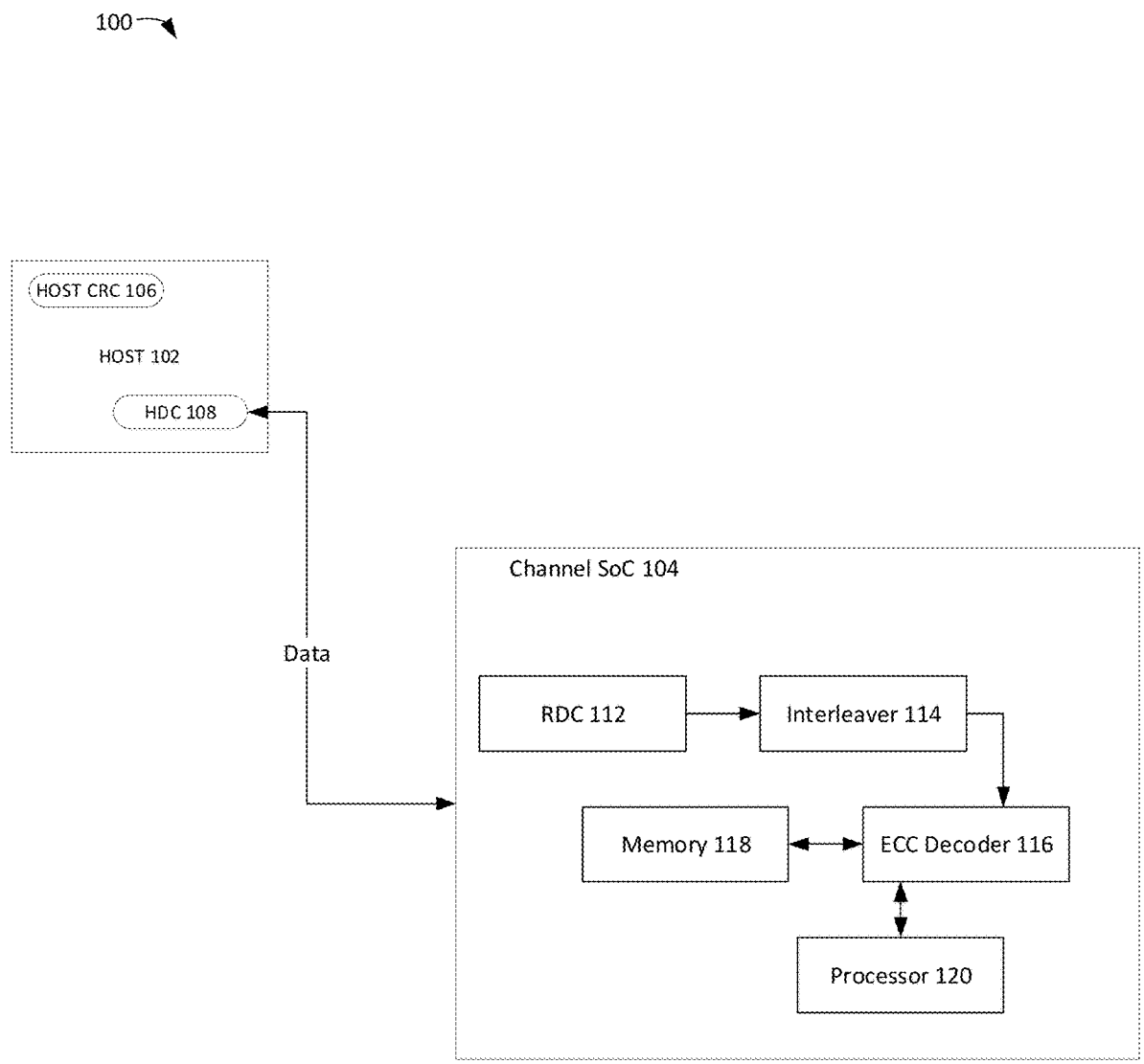
FIG. 1 shows a block diagram that schematically illustrates a data storage system that uses Error Correction Coding (ECC), in accordance with an implementation of the subject matter of this disclosure.

As noted above, in storage applications, having solutions that deal with short error events from an Error Correction Code (ECC) decoder are critical. Typically, a low-density parity check (LDPC) code is used in storage applications. In some data storage applications, the data can be encoded in two dimensions—(i) a row dimension which produces row codewords and (ii) a column dimension which produces column codewords. Each of the row codewords and column codewords have an associated syndrome weight when decoded. When decoding, conventional systems perform one or multiple iterations between the row code and the column code. More particularly, one or more row codewords are decoded iteratively until they produce a zero-syndrome weight. Similarly, one or more column codewords are decoded iteratively until a zero-syndrome weight is achieved. Iterations can also be performed between the row codewords and the column codewords several times. That is, one or more row codewords may be decoded first followed by decoding of one or more column codewords, followed by decoding of one or more row codewords, and so on.

Typically, LDPC decoding produces very particular short error events. There are two types of such short error events—(i) a near-codeword event and (ii) a mis-correction event. In near-codeword events, the LDPC decoded syndrome weight is non-zero. In other words, the LDPC decoder is trapped in a certain state which is not a valid LDPC codeword. In this scenario, the ECC decoder is aware that the error has occurred, as indicated via LDPC decoded non-zero syndrome weight. One conventional way to correct a near-codeword error event is by retrying LDPC decoding with different settings or modified inputs.

Mis-correction events are events where the syndrome weight of decoded LDPC CW is zero, i.e. LDPC decoder produces a valid LDPC codeword, even though the LDPC codeword does not match the desired codeword (transmitted/written data). Correcting the mis-corrections usually require an 'outside' checker and/or detector that such an event occurred. Typically, in storage systems, it is common to have a cyclic redundancy check (CRC) code at the storage host device. In data storage, typically, the data storage (e.g., a hard disk drive or a solid-state drive) controller adds CRC code to the data that is provided to the LDPC encoder. This CRC is used to detect mis-corrections. Once the decoded codeword is sent back to the storage host device, the storage host device CRC confirms whether the decoded codeword matches the written data inputs. CRC can identify (with very high probability, usually) that the decoded codeword is not valid and whether a mis-correction did indeed happen.

As noted above, conventional approaches to correcting such short error events aren't ideal and require multiple iterations of decoding and/or 'outside' checkers. Accordingly, methods and systems for detecting and correcting short error events in decoded codewords are disclosed herein.

Therefore, in accordance with implementations of the subject matter of this disclosure, the codeword is split into a plurality of smaller component codewords and each of the plurality of component codewords are interleaved. That is, the individual bits (or symbols) in each component codeword are re-arranged so that the bit locations across the plurality of component codewords are no longer aligned.

The interleaving of the component codewords is discussed in greater detail below in connection with FIG. 2.

The interleaved component codewords are then decoded using the row code decoder and the column code decoder. In the case of near-codeword error events, the row code (LDPC code) decoder detects the error event based on the non-zero syndrome weight. However, instead of decoding the row code with modified inputs or different settings, the component codewords are decoded using the column code decoder to identify bit (or symbol) locations in the LDPC codeword of interest (i.e., a row codeword having a non-zero syndrome weight). In one implementation where only a single row codeword is known to have the near-codeword error event (i.e., only one row code has a non-zero syndrome weight), the location of the failed syndromes the column code can be used to identify the specific locations of bits (or symbols) within the one row codeword having a non-zero syndrome weight. The near-codeword error can then be corrected by changing the decoded symbol or by flipping the bits at the identified locations within the one row codeword having a non-zero syndrome weight.

In another implementation, there are more than one row codewords include a near-codeword error. In such an implementation, decoding the row codewords and the column codewords identify which row codewords include the near-codeword error (i.e., row codewords having a non-zero syndrome weight) and column codewords including the near-codeword error. However, since there are multiple row codewords with a near-codeword error, the column codewords fail to identify the specific locations within the failed row codewords which need to be changed. Accordingly, in accordance with one implementation, all of the bits (or symbols) corresponding to the failed column codewords are changed in the failed row codewords, thereby correcting the near-codeword error. This, of course, introduces errors in bit locations where the near-codeword error did not occur. However, because the error introduced is short in these implementations, re-decoding the failed row-codewords and column-codewords with the changed bit (or symbol) corrects the introduced error.

In a still another implementation of the subject matter disclosed herein where there are more than one row codewords with near-codeword errors, the ECC decoder first decodes the column codewords to identify columns with non-zero syndrome weight. Next, for each row codeword with non-zero syndrome weight, the bits (or symbols) at all locations corresponding to the identified columns (based on the failed column codewords) are flipped. The row codeword with the flipped bits are re-decoded. If the row codeword syndrome weight is determined to be zero, the near-codeword error is corrected. However, if the row codeword syndrome weight is determined to be non-zero, the column code syndrome re-computed to identify new columns within the re-decoded row codeword having a non-zero syndrome weight. Based on the new column code syndrome weights, the row codeword data can be modified (by flipping the bits) again and re-decoded until a zero-syndrome weight is reached. Similarly, the remaining row codewords with a near-codeword error can also be corrected using methods consistent with the disclosure herein.

In an implementation, the original decoder input or the decoder output are buffered in a memory so that they can be modified, and re-decoding can be performed with modified bits. In one implementation, the decoding can be performed from the stored hard decision output (stored decoder output) or from the stored input of LDPC decoder, which may be a soft or a hard input. In either case, the bits are flipped (or the symbols are changed) in selected locations as described above. In an embodiment, the "flip" can be a "soft flip" or a "hard flip". For example, in binary LDPC codes, a soft flip means that the sign of soft input can be changed on the selected locations (typically, this decoder input is an LLR message). A hard flip means that the hard input is flipped. Once the input is modified in that way, the LDPC code is re-decoded with the modified input.

In some implementations, the decoded input or output is not stored. In these instances, the decoder input (or output) is regenerated from other data stored in Channel System-on-Chip (SoC). Typically, the data that is stored in storage Channel SoC are digital samples in some domain. This may not necessarily be decoder input but some other samples (e.g., samples immediately following A/D converter or samples at different points in the front-end of Channel SoC), as will be described below in connection with FIG. 1.

On the other hand, when there is a mis-correction error event, all of the row codewords (e.g., LDPC codewords) reach a zero-syndrome weight. In an implementation, the column codeword (e.g., a Single Parity Check (SPC) code) is checked to determine whether there are any mis-correction events. If some column codewords are not satisfied (i.e., the syndrome weight is non-zero), it is determined that there are mis-correction errors present in the row codewords.

Interleaving the row codewords is critical in this implementation. If no interleaving is performed, the mis-correction (MC) on one row codeword could lead to another row codeword mis-correcting in the exact same locations given that all row codewords represent the same underlying LDPC code, as is commonly the case. Once the row codewords are interleaved, same locations in different row codewords correspond to different column codewords and hence it is extremely unlikely that a mis-correction in one row codeword could lead to another mis-correction in another row codeword.

In some implementation where there is a single row codeword with a mis-correction, all row codewords are first decoded. Once the column codewords are decoded, the exact column locations of the mis-correction errors are known even though the particular row codeword is not known. In a particular implementation, bits (or symbols) corresponding to the identified column locations for each row codeword are flipped and re-decoded iteratively until a zero-syndrome weight is satisfied for all of the row codewords.

In some implementations, there are more than one row codewords with mis-correction error events. In such instances, when the column codewords are not satisfied (i.e., there are column codewords with non-zero syndrome weight), some of the column locations of the mis-corrections are known. However, overlapping locations of mis-corrections across two or more row codewords can still provide a zero-syndrome weight. Therefore, there exists a scenario, where both column codewords and row codewords provide a zero-syndrome weight if the mis-correction occurs at the same exact location. However, the likelihood of such an overlapping mis-correction is significantly reduced due to the interleaving of each row codeword prior to decoding.

In an instance where there are multiple row codewords with mis-correction error events, in accordance with one implementation, all the inputs bits (or symbols) are flipped in non-overlapping locations as indicated by the column codewords. The row codewords are then re-decoded one by one with the changed inputs. Once a row codeword that has mis-corrected is reached, the re-decoding of such a codeword with modified inputs results in a valid codeword that is different from the originally decoded codeword. In one implementation, the column codewords are re-checked to confirm that there are no other mis-correction error events.

As noted previously, the original decoder input or decoder output needs to be stored in a memory buffer so that the various bits (or symbols) can be flipped and re-decoded as needed in accordance with the various implementations discussed above. This allows for the Channel SoC to ensure that all the component codewords have been decoded correctly before sending the data back to the storage host device for verification. However, if the number of row codewords is large, it may not be feasible to buffer all of those codewords before sending the data back to the storage host device. In an implementation, the row codewords may be split into multiple groups. Once a particular group of row codewords has been verified by column codeword decoding (i.e., column codewords have a zero-syndrome weight for a particular group of row codewords), then the row codewords in the group can be transferred to the storage host device and the data cleared from the memory buffer. In various implementations, any number of row codewords can be grouped together.

As discussed above, conventional approaches to detecting mis-correction error events involve sending the decoded data back to the storage host device for verification via a cyclic redundancy check (CRC). Implementations in accordance with the subject matter disclosed herein provide for detection of a mis-correction error event prior to transferring the decoded data to the storage host device. In one implementation, the channel SoC includes a local CRC which can verify codewords locally prior to transferring the decoded data back to the storage host device. In one embodiment of this implementation, the local CRC can verify each partial portion of the row codewords prior to transferring that particular portion back to the storage host device.

In another implementation, as soon as a row codeword is decoded (i.e., row codeword has a zero-syndrome), the row codeword is transferred to the storage host device. If there are column codewords with non-zero syndrome, the Channel SoC can request the storage host device to send back the data. In the meantime, the storage host device can check its own CRC and determine which row codeword mis-corrected. If only one such row codeword is found, the storage host device can send the one row codeword back to the Channel SoC to be corrected. Then, after correction at Channel SoC in accordance with methods discussed above, this codeword can be transferred again to the storage host device.

In still another implementation, a CRC may be shared and/or mirrored between the storage host device and the Channel SoC. Specifically, the storage host device CRC is mirrored at the Channel SoC, thereby simplifying the verification process.

The subject matter of this disclosure may be better understood by reference to FIGS. 1-12.

FIG. 1 is a block diagram that schematically illustrates a data storage system 100 that uses error correction coding, in accordance with an embodiment that is described herein. System 100 comprises a storage host device 102 which sends data to a Channel System-on-Chip (SoC) 104. In the implementation of FIG. 1, storage host device 102 includes a hard disk controller (HDC) 108 and a local cyclic redundance check (CRC) code 106. HDC 108 receives data to be stored by the storage host device 102 (e.g., a personal computer). HDC 108 then sends this data, together with the CRC, to Channel SoC 104 to be written. Channel SoC 104 includes a read/write channel (RDC) 112. RDC 112 encodes the data received from HDC 108 with, for instance, a low-density parity check (LDPC) code, and writes the received data to a media. At a later time when the storage host device 102 requests the data from HDC 108, HDC 108 issues a read command to RDC 112 to read the data. RDC 112 reads data of the media and tries to decode the LDPC codewords before sending the data to HDC 108. HDC 108 determines whether the CRC matches before sending the data on to the storage host device 102. Although FIG. 1 shows HDC 108 residing within the storage host device 102, HDC 108 may also reside in Channel SoC 104 in other implementations.

As mentioned above, RDC 112, in response to receiving a request for the previously written data from HDC 108, reads data of the media and tries to decode the LDPC codewords before sending the data to HDC 108. Specifically, interleaver 114 partitions the written data into a plurality of smaller component codewords (e.g., LDPC codewords) and interleaves the bits (or symbols) of each of the plurality of smaller component codewords. The interleaved component codewords are then decoded by an ECC decoder 116. Decoder 116 is controlled by a processor 120. In one implementation, decoder 116 buffers the decoding input or output in memory 118. In an implementation, decoder 116 includes a LDPC decoder and a SPC decoder. The functionality of decoder 116 are described in detail below. By decoding the ECC, decoder 116 reconstructs the data that was previously written on the media. The reconstructed data is provided as the Channel SoC output.

Figure 2:
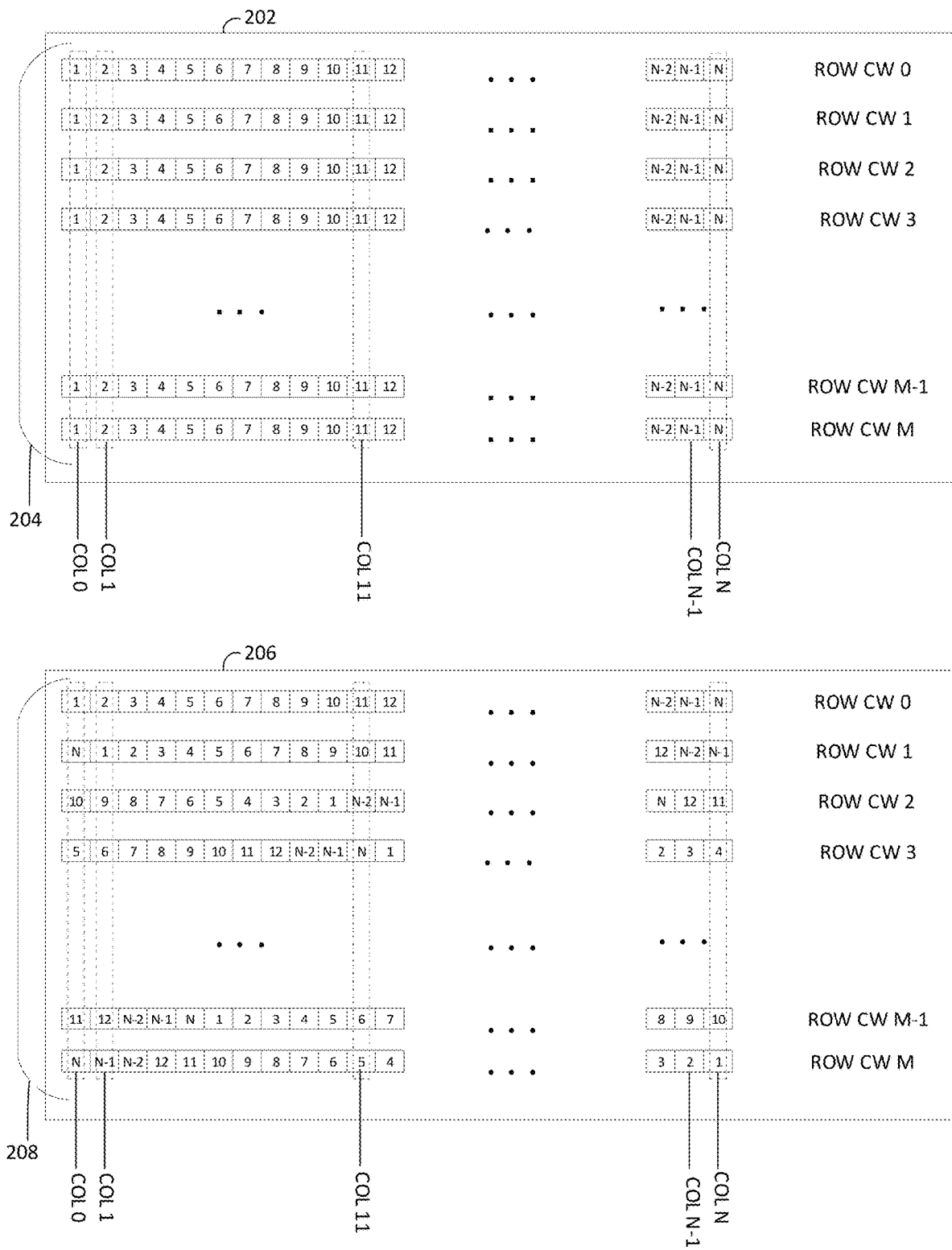
FIG. 2 shows an example codeword interleaving process in accordance with implementations of the subject matter of this disclosure.

FIG. 2 shows an example codeword interleaving process in accordance with implementations of the subject matter of this disclosure. User data 202 includes a codeword divided into a M number of component codewords 204, where M is an integer greater than 0. In an implementation, the codeword to be decoded is divided into 32 component codewords. Each component codeword 204 includes N number of bits or symbols, where N is an integer greater than 0. User data 202 shown in FIG. 2 is data encoded in two dimensions by the Storage host device 102. Data encoded along a row dimension produces a row codeword and data encoded along a column dimension produces a column codeword. Accordingly, as further shown in FIG. 2, the component codewords 204 are arranged in an array having M number of rows and N number of columns. Each of the M number of row codewords (ROW CW 0-M) and the N number of column codewords (COL 0-N) has a respective syndrome output. In an implementation, the row codewords are an LDPC codewords. While discussion below describes the present disclosure in the context of LDPC codewords, other component codewords other codes may also be used. In an implementation, the column codewords are SPC codewords.

User data 202 is arranged in accordance with conventional approaches to decoding. In particular, first one or more of the row codewords are decoded followed by decoding the one or more column codewords. However, as discussed above, this approach may lead to mis-correction error events that the decoder fails to detect and/or correct at receiver 104. In contrast, user data 206 shows a plurality of component codewords 208, the bits or symbols of each of which have been interleaved (rearranged). As shown in FIG. 2, the bits or symbols of each of the row codewords have been rearranged so that they do not align with adjacent row codewords. The benefits of this rearrangement will be explained in greater detail below in connection with FIGS. 3-6.

Figure 3:
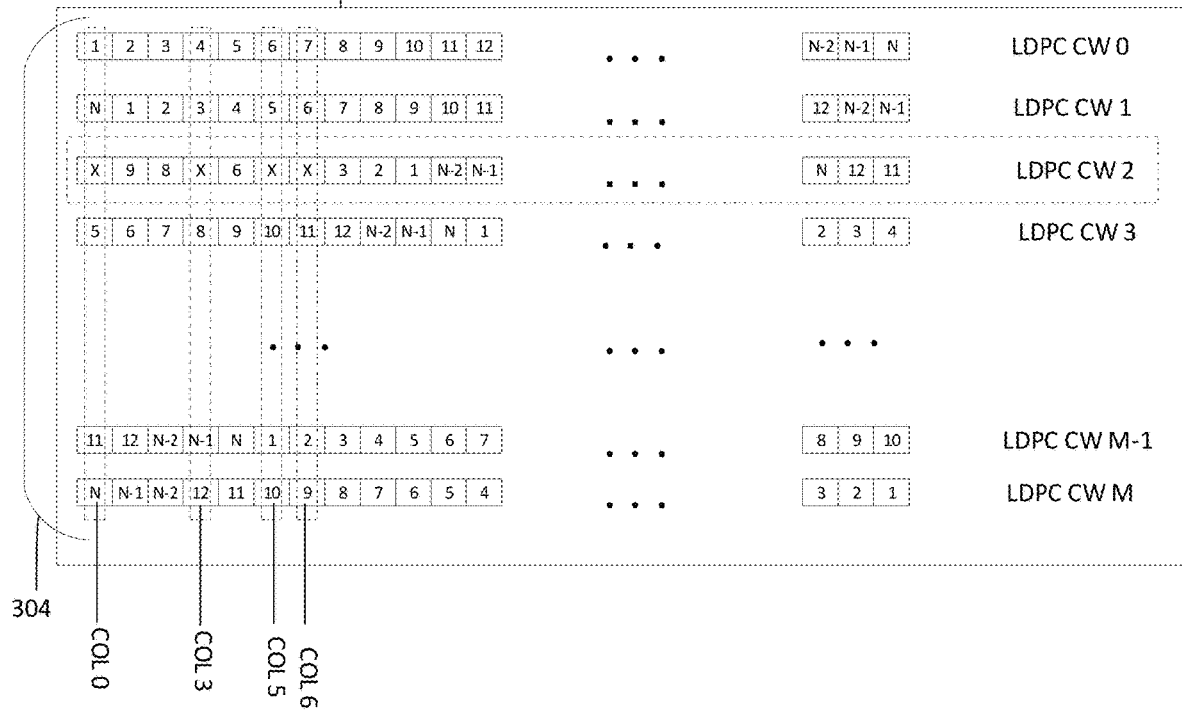
FIG. 3 shows an example near-codeword error correction process in accordance with implementations of the subject matter of this disclosure.
Figure 3:
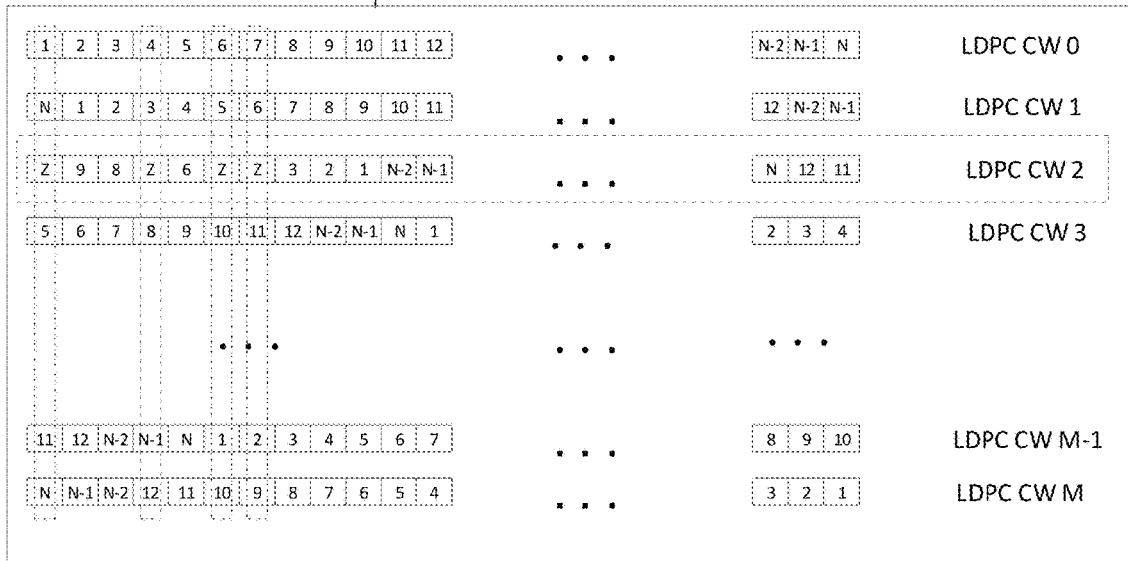

FIG. 3 shows an example near-codeword error detection and correction process in accordance with implementations of the subject matter of this disclosure. User data 302 shows the results of decoding the row LDPC codewords and the column SPC codewords. In particular, ECC decoder 116 decodes all of the row LDPC codewords 304 to generate a first set of decoding results (i.e., associated syndrome weights for each row codeword). Next, the ECC decoder 116 decodes all of the column SPC codewords to generate a second set of decoding results (i.e., associated syndrome weights for each column codeword). As seen in the example of FIG. 3, LDPC CW 2 is determined to be the one row codeword with a non-zero syndrome weight indicating a near-codeword error event. However, decoding of the row codeword alone does not identify the location of the bits or symbols within LDPC CW 2 which need to be corrected. As discussed above, conventional methods for correcting such an error involve re-decoding LDPC CW 2 with modified decoder settings. However, implementations in accordance with the subject matter disclosed herein rely on the column codeword decoding results to identify the specific bit or symbol locations that need to be corrected.

Specifically, ECC decoder 116 determines column codewords having a non-zero syndrome weight (i.e., Col CWs 0, 3, 5, and 6). Since there is only one row codeword with a non-zero syndrome weight (LDPC CW 2), ECC decoder 116 flips the bits or symbols located at columns 0, 3, 5, and 6 as shown in user data 304. ECC decoder 116 then re-decodes the LDPC codewords to confirm that the all of the row codewords produce a zero-syndrome weight.

Figure 4:
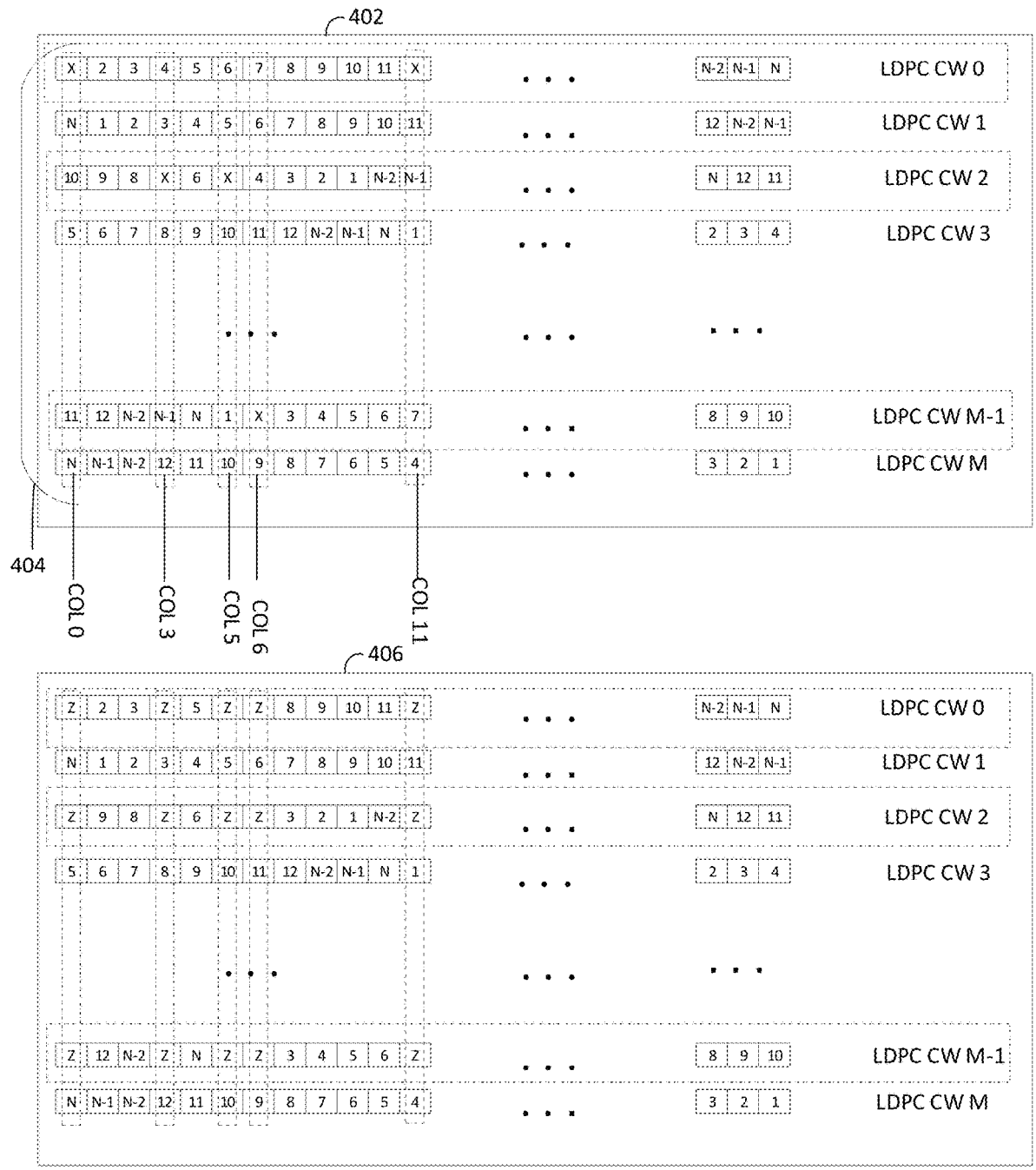
FIG. 4 shows another example near-codeword error correction process in accordance with implementations of the subject matter of this disclosure.

FIG. 4 shows another example near-codeword error correction process in accordance with implementations of the subject matter of this disclosure in which more than one row codewords include a near-codeword error. User data 402 shows the results of decoding the row LDPC codewords and the column SPC codewords. In particular, ECC decoder 116 decodes all of the row LDPC codewords 404 to generate the first set of decoding results (i.e., associated syndrome weights for each row codeword). As seen in FIG. 4, LDPC CW 0, LDPC CW 2, and LDPC CW M−1 are determined to have a non-zero syndrome weight indicating a near-codeword error event within those row codewords. However, the specific bit or symbol locations of the errors are unknown at this stage.

Next, the ECC decoder 116 decodes all of the column SPC codewords to generate a second set of decoding results (i.e., associated syndrome weights for each column codeword). As seen in the example of FIG. 4, column codewords 0, 3, 5, 6, and 11 are determined to have a non-zero syndrome weight. However, since there are multiple row codewords with non-zero syndrome weights, the precise location of the near-codeword errors in the row codewords is not known. In one implementation, as shown in user data 406 of FIG. 4, ECC decoder 116 flips all of the bits or symbols in LDPC CWs 0, 2, and M−1 located at columns corresponding to the non-zero syndrome weight column codewords. Once the bits or symbols have been flipped, ECC decoder 116 re-decodes LDPC CWs 0, 2, and M−1. If all LDPC codewords are corrected, the process stops there. If there is only one LDPC codeword showing a non-zero syndrome weight, ECC decoder 116 re-decoded using the SPC decoder to identify specific column locations of the erroneous bits or symbols as described above in connection with FIG. 3.

However, if there are still more than one LDPC codewords with a non-zero syndrome weight, ECC decoder 116 proceeds with a serial decoding process, in accordance with one implementation. In accordance with this implementation, ECC decoder 116 first takes one LDPC codeword having a non-zero syndrome weight (e.g., LDPC CW 0) and modifies the bits or symbols in all locations identified by the column codes (e.g., columns 0, 3, 5, 6, and 11). Then, the LDPC codeword with the modified bits or symbols is re-decoded. If the LDPC codeword is corrected, the process ends. However, if the LDPC codeword still has a non-zero syndrome weight, ECC decoder decodes the column codewords again to identify new column locations with non-zero syndrome weight. Based on the new column syndrome weights, a new set of bit locations in the LDPC codewords are modified. ECC decoder 116 repeats these steps for each of the row codewords having a non-zero syndrome weight until all of the row codewords converge to zero syndrome weights. As noted above, the decoding output after each iteration is stored in memory buffer 118 so that ECC decoder can modify the bits or symbols as outlined above.

Figure 5:
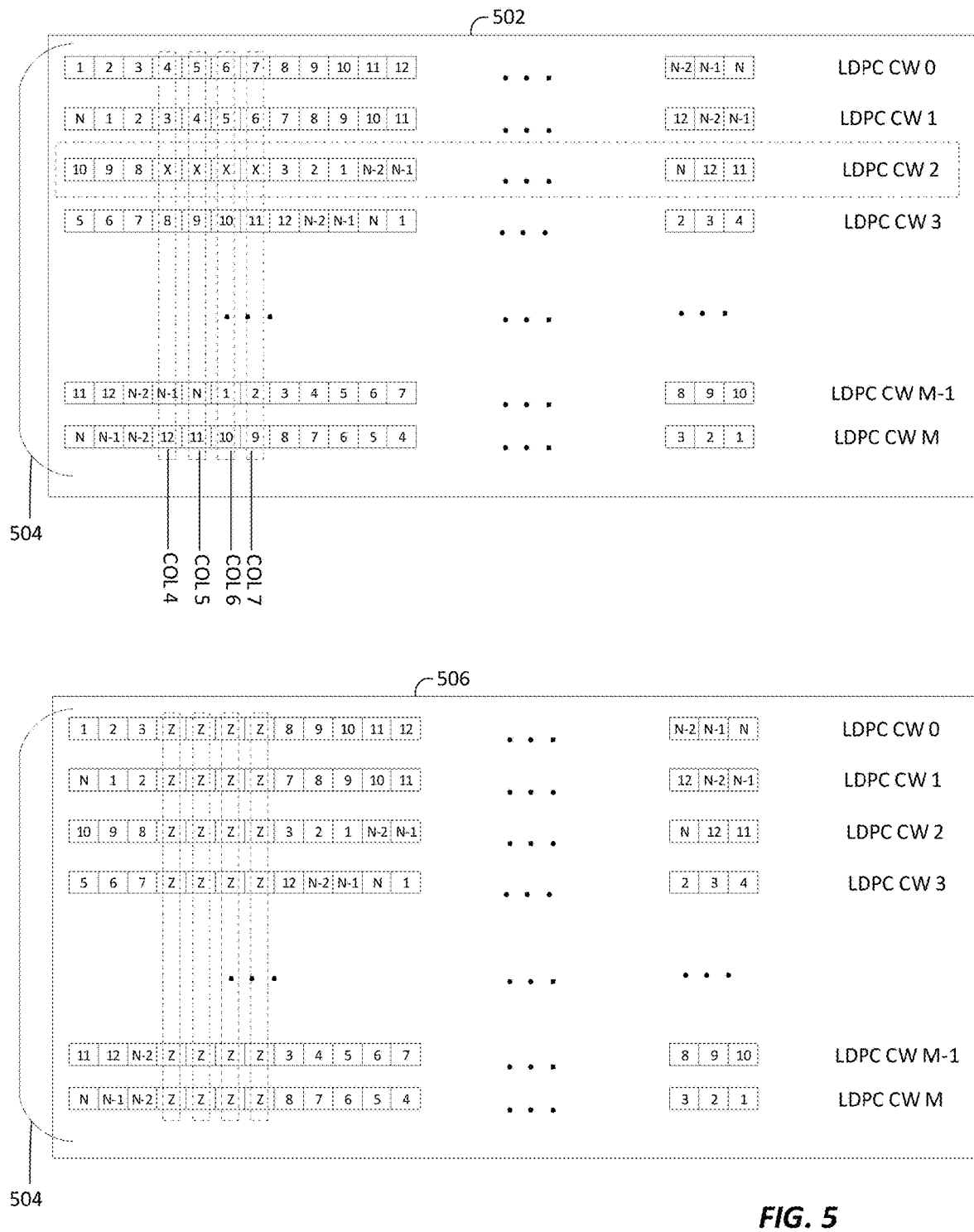
FIG. 5 shows another example mis-correction error correction process in accordance with implementations of the subject matter of this disclosure.

FIG. 5 shows another example mis-correction error correction process in accordance with implementations of the subject matter of this disclosure. As discussed above, when there is a mis-correction error event, all of the row codewords (e.g., LDPC codewords) reach a zero-syndrome weight, even though certain bits or symbols have been decoded incorrectly. As shown in FIG. 5, ECC decoder 116 decodes the column codeword (e.g., using a Single Parity Check (SPC) code) to determine whether there are any mis-correction events. As shown in FIG. 5, ECC decoder 116 determines that columns 4, 5, 6, and 7 contain mis-correction error events based on the column decoding results. However, the row codewords containing the mis-correction error events are unknown at this stage.

As further shown in user data 504 of FIG. 5, ECC decoder modifies the bits or symbols located at columns 4, 5, 6, and 7 in all of the row codewords. In the implementation shown in FIG. 5, since there is only one row codeword with the mis-correction error, ECC decoder 116 can identify the row codeword with the mis-correction error by re-decoding each of the row codewords.

Interleaving the row codewords is critical in this implementation. If no interleaving is performed, the mis-correction on one row codeword could lead to another row codeword mis-correcting in the exact same locations. Specifically, if the bits of user data 502 are not interleaved, modifying the bits in columns 4, 5, 6, and 7 will produce a zero-syndrome row codeword output in every other row codeword given that all row codewords represent the same underlying LDPC code, as is commonly the case. Once the row codewords are interleaved, same locations in different row codewords correspond to different column codewords and hence it is extremely unlikely that a mis-correction in one row codeword could lead to another mis-correction in another row codeword when the bits are modified as described above.

Figure 6:
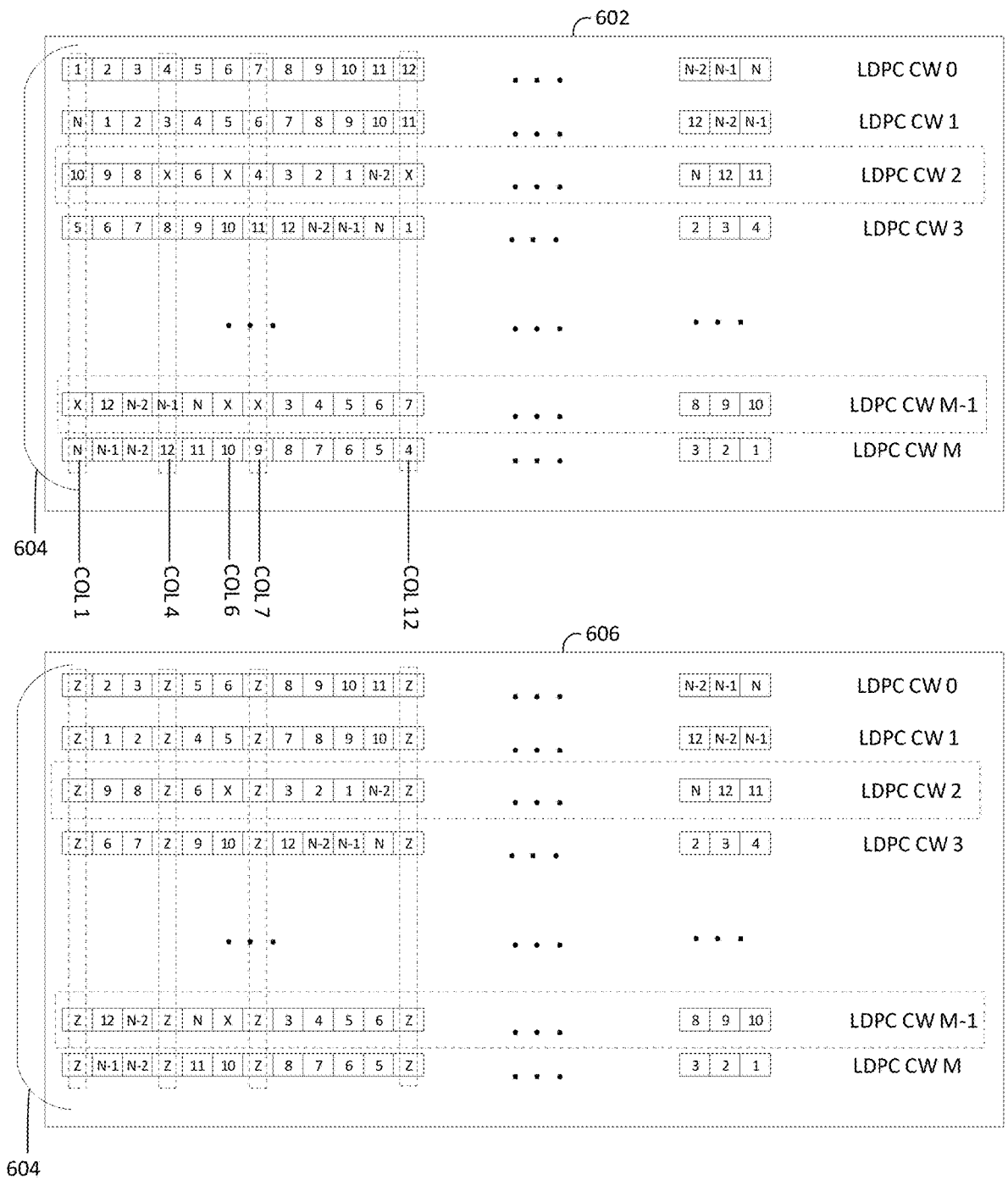
FIG. 6 shows another example mis-correction error correction process in accordance with implementations of the subject matter of this disclosure.

In some implementations, there are more than one row codewords with mis-correction error events, which will be described below in connection with FIG. 6. More particularly, as shown in FIG. 6, user data 602 shows that row codewords 604 all produce zero-syndrome weight (i.e., there are no near-codeword errors). However, as further shown in FIG. 6, ECC decoder 116 identifies a mis-correction error event in the row codewords based on a column codeword decoding operation. As shown in FIG. 6, columns 1, 4, 7, and 12 are indicated as having a non-zero syndrome weight. Note that although column 6 also includes a mis-correction error event, the column decoder is unable to identify the mis-correction because of the overlap in the mis-correction across LDPC CW 2 and LDPC CW M−1. That is, overlapping locations of mis-corrections across two or more row codewords can still provide a zero-syndrome weight. Therefore, there exists a scenario, where both column codewords and row codewords provide a zero-syndrome weight if the mis-correction occurs at the same exact location. However, the likelihood of such an overlapping mis-correction is significantly reduced due to the interleaving of each row codeword prior to decoding.

In the example shown in FIG. 6, where there are multiple row codewords (LDPC CW 2 and LDPC CW M−1) with mis-correction error events, in accordance with one implementation, the inputs bits (or symbols) are flipped in all of the non-overlapping locations as indicated by the column codewords. Specifically, user date 606 shows that all of the bits or symbols in columns 1, 4, 7, and 12 are flipped. ECC decoder 116 then re-decodes each of the row codewords one by one with the changed inputs. Once the ECC decoder 116 reaches a row codeword that has mis-corrected, the re-decoding of such a row codeword (e.g., LDPC CW 2) can result in a different valid codeword (i.e., zero-syndrome weight) than the one originally decoded, thus revealing that the particular row codeword had previously mis-corrected. The ECC decoder 116 then re-decodes the column codewords to identify new column locations with non-zero syndrome weights. This process is iteratively performed until all of the column codewords are satisfied (i.e., produce a zero-syndrome weight).

Figure 7:
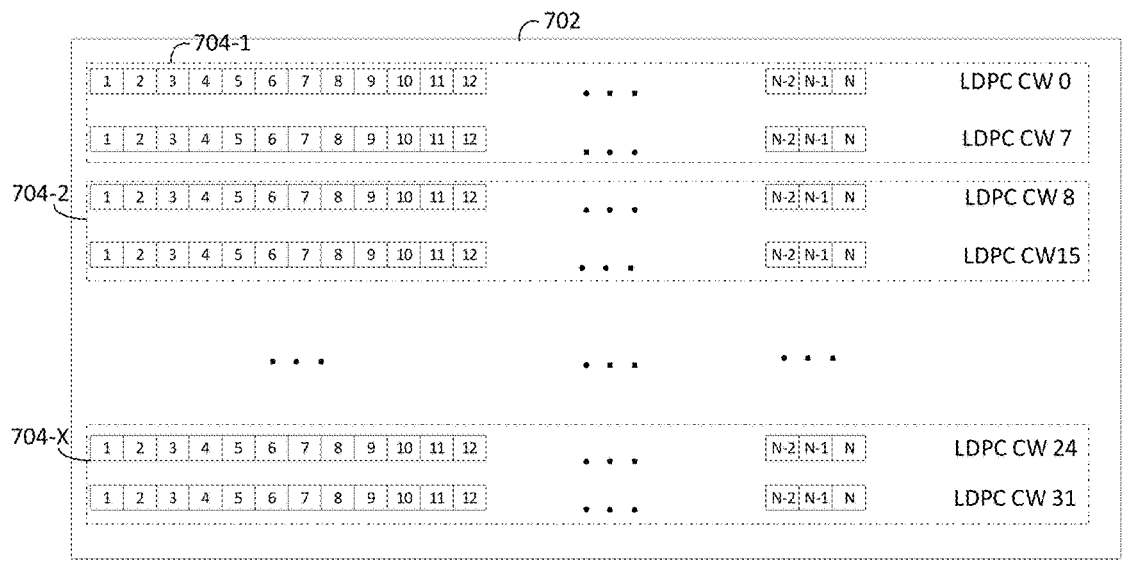
FIG. 7 shows a codeword grouping process in accordance with implementations of the subject matter of this disclosure.

FIG. 7 shows a codeword grouping process in accordance with implementations of the subject matter of this disclosure. As discussed above, the original decoder input or decoder output needs to be stored in a memory buffer so that the various bits (or symbols) can be flipped and re-decoded as needed in accordance with the various implementations discussed above. This allows for the Channel SoC to ensure that all the component codewords have been decoded correctly before sending the data back to the storage host device for verification. However, if the number of row codewords is large, it is not feasible to buffer all of those codewords before sending the data back to the storage host device.

In an implementation shown in FIG. 7, a grouping solution is described to address the memory buffer concern. As shown in FIG. 7, the row codewords may be split into multiple groups 704-1, 704-2, . . . , 704-X. In the example shown in FIG. 7, where there is a total of 32 component row codewords, each group may include 8 row codewords. A first group (704-1) may cover the first quarter of row codewords (first 8 CWs) while a second group (704-2) may cover the second quarter of row codewords (next 8 CWs). It will be understood that the number of row codewords in any group does not need to be equal across the groups. In one implementation, verification of each individual group is done separately. If all row and column codewords in one particular group are satisfied (i.e., all row and column codewords have a zero syndrome weight), then all of the row codewords included in that group can be transferred to Storage host device, thereby reducing the needed buffering of the row codewords in memory 118.

Figure 8:
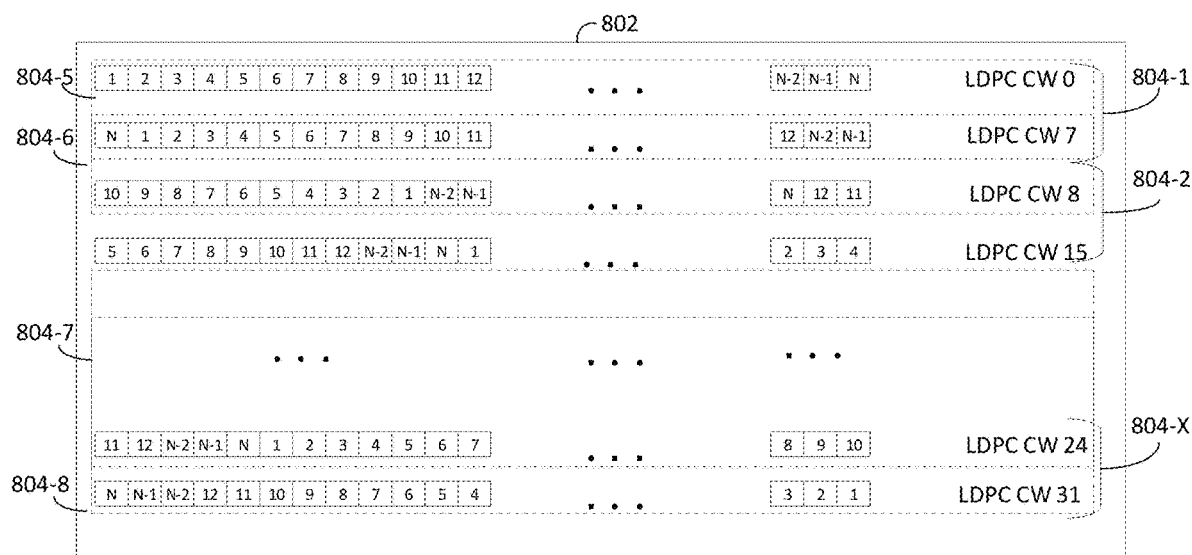
FIG. 8 shows another codeword grouping process in accordance with implementations of the subject matter of this disclosure.

FIG. 8 shows another codeword grouping process in accordance with implementations of the subject matter of this disclosure. In the implementation shown in FIG. 8, the row codeword grouping includes a layered approach, where a same row codeword is included in multiple groups. For example, as shown in FIG. 8, the 32 row codewords are divided into four groups of 8 row codewords consistent with the discussion above in reference to FIG. 7. In addition, the 32 row codewords are also grouped into 4 additional groups. In one implementation, group 804-5 includes row codewords 0, 2, 4, 6, 8, 10, 12, and 14, group 804-6 includes row codewords 1, 3, 5, 7, 9, 11, 13, and 15, group 804-7 includes row codewords 16, 18, 20, 22, 24, 26, 28, and 30, while group 804-8 includes row codewords 17, 19, 21, 23, 25, 27, 29, and 31. Similar to the discussion in connection with FIG. 7, verification of each individual group is done separately in one implementations. If all row and column codewords in one particular group are satisfied (i.e., all row and column codewords have a zero syndrome weight), then all of the row codewords included in that group can be transferred to Storage host device, thereby reducing the needed buffering of the row codewords in memory 118.

Figure 9:
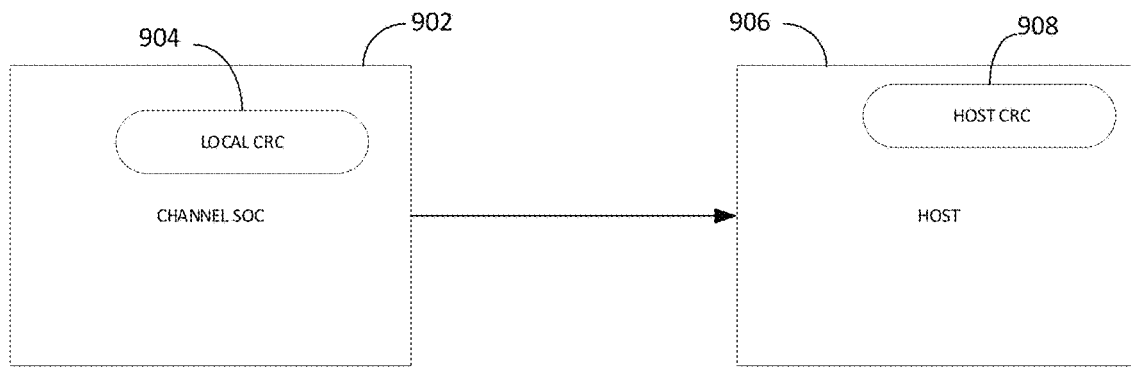
FIG. 9 shows details of an implementation of error correction verification circuitry in accordance with implementations of the subject matter of this disclosure.

FIG. 9 shows details of an implementation of error correction verification circuitry in accordance with implementations of the subject matter of this disclosure. As discussed above, conventional approaches to detecting mis-correction error events involve transferring the decoded data back to the storage host device for verification via a cyclic redundancy check (CRC). Implementations in accordance with the subject matter disclosed herein provide for detection of a mis-correction error event prior to transferring the decoded data to the storage host device. In the implementation shown in FIG. 9, channel SoC 902 includes a local CRC 904 which can verify codewords locally prior to sending the decoded data back to the storage host device 906 which can then re-verify the received codewords using its own CRC 908. In one embodiment of this implementation, the local CRC 904 can verify each partial portion of the row codewords prior to sending that particular portion to the storage host device 906.

Figure 10:
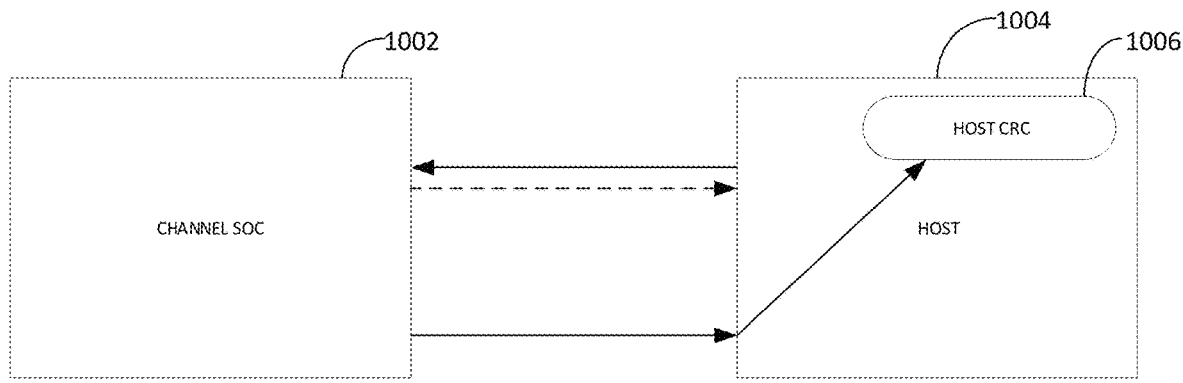
FIG. 10 shows details of another implementation of error correction verification circuitry in accordance with implementations of the subject matter of this disclosure.

FIG. 10 shows details of another implementation of error correction verification circuitry in accordance with implementations of the subject matter of this disclosure. In another implementation shown in FIG. 10, as soon as a row codeword is decoded (i.e., row codeword has a zero-syndrome), the row codeword is sent from Channel SoC 1002 to the storage host device 1004. If there are column codewords with non-zero syndrome, Channel SoC 1002 can request the storage host device 1004 (via its hard disk controller such as HDC 108) to send back the data. In the meantime, storage host device 1004 can check its own CRC 1006 and determine which row codewords have mis-corrected. If only one such row codeword is found, the storage host device can send the one row codeword back to the Channel SoC 1002 to be corrected. Then, after correction at Channel SoC 1002 in accordance with methods discussed above, the corrected codeword can be sent again to storage host device 1004.

Figure 11:
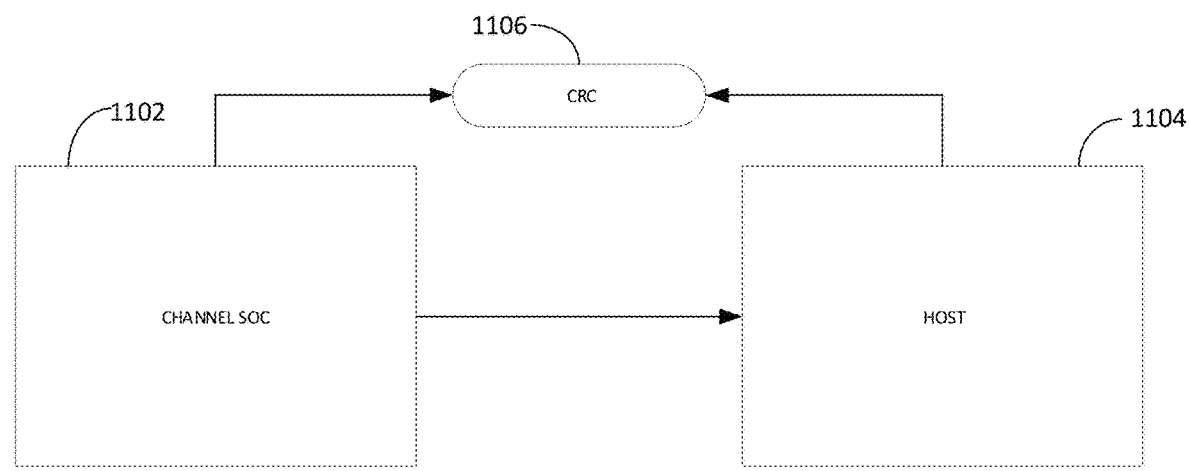
FIG. 11 shows details of another implementation of error correction verification circuitry in accordance with implementations of the subject matter of this disclosure.

FIG. 11 shows details of another implementation of error correction verification circuitry in accordance with implementations of the subject matter of this disclosure. In another implementation shown in FIG. 11, a CRC 1106 may be shared and/or mirrored between the storage host device 1104 and the Channel SoC 1102. Specifically, storage host device CRC 1106 is mirrored at the Channel SoC 1102, thereby simplifying the verification process. Channel SoC 1102 can monitor the output of the CRC 1106 and correct any mis-correction events without requiring the storage host device 1104 to transfer any additional data.

Figure 12:
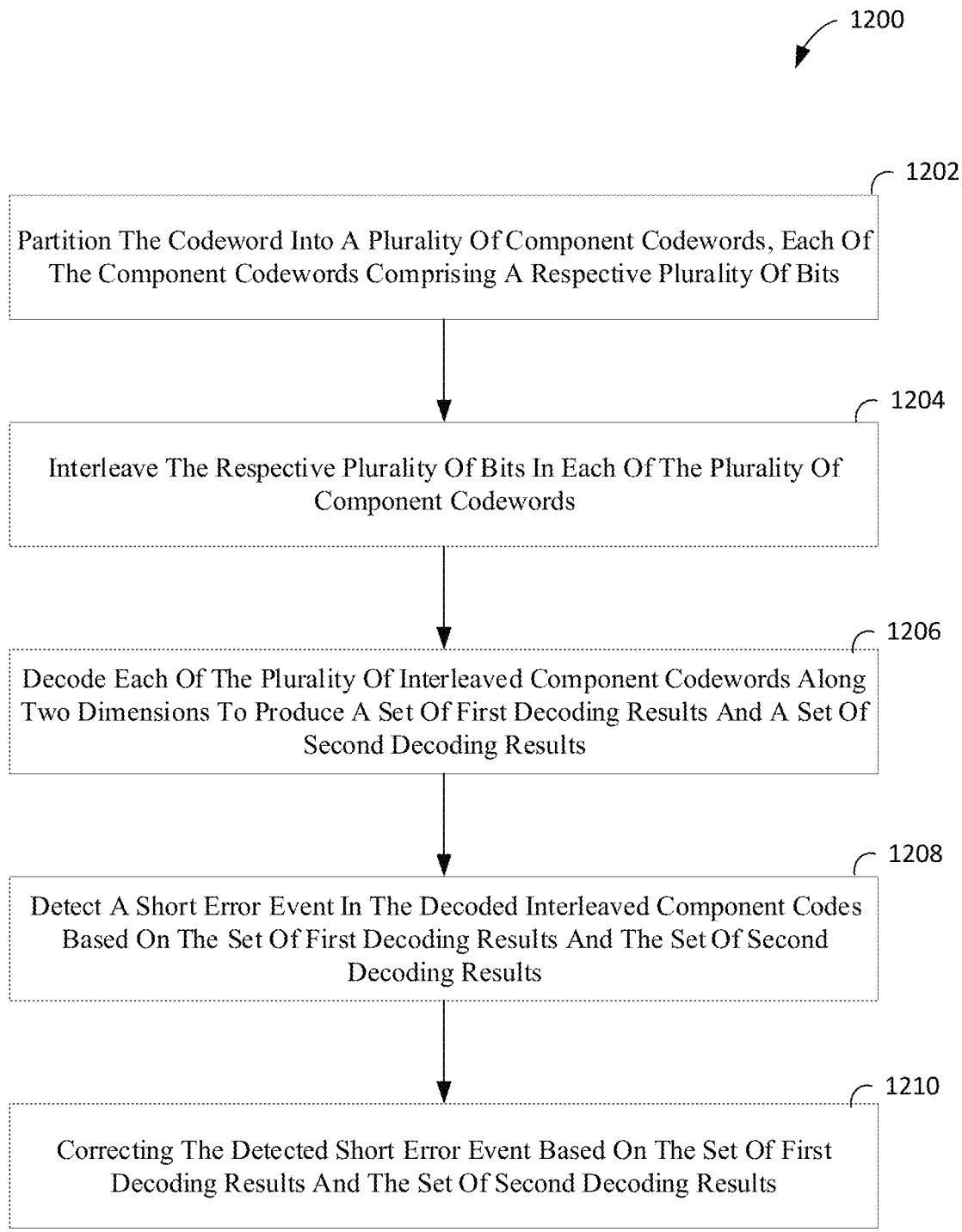
FIG. 12 is a flow diagram illustrating a method according to implementations of the subject matter of this disclosure.

A short error event detection and correction method 1200 according to implementations of the subject matter of this disclosure is diagrammed in FIG. 12. At 1202, a codeword is partitioned into a plurality of component codewords, where each of the component codewords comprise a respective plurality of bits or symbols. At 1204, the respective plurality of bits in each of the plurality of component codewords are interleaved or rearranged. At 1206, each of the plurality of interleaved component codewords are decoded along two dimensions to produce a set of first decoding results and a set of second decoding results. At 1208, a short error event is detected in the decoded interleaved component codes based on the set of first decoding results and the set of second decoding results. Lastly, at 1210, the detected short error event is corrected based on the set of first decoding results and the set of second decoding results.

Thus it is seen that a method and circuitry for short error event detection and correction has been provided.

As used herein and in the claims which follow, the construction "at least one" shall mean "one or more."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for decoding a codeword comprising:
    partitioning the codeword into a plurality of component codewords, each of the component codewords comprising a respective plurality of bits;
    interleaving the respective plurality of bits in each of the plurality of component codewords;
    decoding each of the plurality of interleaved component codewords along two dimensions to produce (i) a set of first decoding results and (ii) a set of second decoding results;
    detecting, in the decoded interleaved component codewords based on (i) the set of first decoding results and (ii) the set of second decoding results, a short error event that is one of (a) a near-codeword event in which a syndrome weight of an output decoded codeword is non-zero, or (b) a mis-correction event in which a syndrome weight of an output decoded codeword is zero but the output decoded codeword does not match a desired codeword; and
    correcting the detected short error event based on (i) the set of first decoding results and (ii) the set of second decoding results.

2. The method for decoding the codeword of claim 1, wherein:
    the plurality of component codewords form an array comprising (i) M row codewords and (ii) N column codewords where M and N are integers greater than 0, and
    decoding each of the plurality of interleaved component codewords along two dimensions comprises:
    decoding each of the M row codewords to produce the set of first decoding results corresponding to each of the M rows of the array; and
    decoding each of the N column codewords to produce the set of second decoding results corresponding to each of the N columns of the array.

3. The method for decoding the codeword of claim 2, wherein detecting the short error event in the decoded interleaved component codewords based on (i) the set of first decoding results and (ii) the set of second decoding results comprises:
    determining whether at least one row codeword of the M row codewords has a non-zero syndrome weight based on the corresponding first decoding result; and
    in response to determining that at least one row codeword of the M row codewords has a non-zero syndrome weight based on the corresponding first decoding result, detecting a near-codeword error event as the short error event in the decoded interleaved component codewords.

4. The method for decoding the codeword of claim 3, wherein correcting the detected near-codeword error event based on (i) the set of first decoding results and (ii) the set of second decoding results comprises:
    identifying, based on the corresponding second decoding result, at least one column codeword of the N column codewords having a non-zero syndrome weight;
    identifying, based on the at least one column codeword having the non-zero syndrome weight, at least one bit location in the at least one row codeword having the non-zero syndrome weight;
    flipping a bit located at the at least one identified bit location in the array; and
    decoding the at least one row codeword with the flipped bit.

5. The method for decoding the codeword of claim 2 wherein detecting the short error event in the decoded interleaved component codewords based on (i) the set of first decoding results and (ii) the set of second decoding results comprises:
    determining, based on the corresponding first decoding result, whether at least one row codeword of the M row codewords has a non-zero syndrome weight;
    in response to determining that none of the M row codewords have a non-zero syndrome weight based on the corresponding first decoding result, determining, based on the corresponding second decoding result, whether at least one column codeword of the N column codewords has a non-zero syndrome weight;
    in response to determining that at least one column codeword of the N column codewords has a non-zero syndrome weight based on the corresponding second decoding result, detecting a mis-correction error event as the short error event in the decoded interleaved component codewords.

6. The method for decoding the codeword of claim 5 wherein correcting the detected mis-correction error event based on (i) the set of first decoding results and (ii) the set of second decoding results comprises:
    identifying, based on the corresponding second decoding result, at least one column codeword of the N column codewords having a non-zero syndrome weight;
    flipping a bit within each of the M row codewords at a location corresponding to the identified at least one column codeword; and
    iteratively decoding the M row codewords including the flipped bit.

7. The method for decoding the codeword of claim 6, further comprising:
    determining whether at least one row codeword of the M row codewords including the flipped bit produces a non-zero syndrome weight;
    in response to determining that at least one row codeword of the row codeword of the M row codewords including the flipped bit produces a non-zero syndrome weight, re-flipping the flipped bit and re-decoding the at least one row codeword including the re-flipped bit.

8. The method for decoding the codeword of claim 6, further comprising:
    re-decoding the N column codewords including the flipped bit.

9. The method for decoding the codeword of claim 1, further comprising:

performing a cyclic redundancy check on the plurality of component codewords with the corrected short error event.

10. The method for decoding the codeword of claim 1 wherein the N column codewords are of an interleaved single parity check (SPC) code and wherein the M row codewords are of an interleaved low-density parity check (LDPC) code.

11. An apparatus for decoding a codeword, the apparatus comprising:
    an interleaver configured to:
    partition the codeword into a plurality of component codewords, each of the component codewords comprising a respective plurality of bits; and
    interleave the respective plurality of bits in each of the plurality of component codewords; and
    a decoder configured to:
    decode each of the plurality of interleaved component codewords along two dimensions to produce (i) a set of first decoding results and (ii) a set of second decoding results;
    detect, in the decoded interleaved component codewords based on (i) the set of first decoding results and (ii) the set of second decoding results, a short error event that is one of (a) a near-codeword event in which a syndrome weight of an output decoded codeword is non-zero, or (b) a mis-correction event in which a syndrome weight of an output decoded codeword is zero but the output decoded codeword does not match a desired codeword; and
    correct the detected short error event based on (i) the set of first decoding results and (ii) the set of second decoding results.

12. The apparatus for decoding the codeword of claim 11, wherein the plurality of component codewords form an array comprising (i) M row codewords and (ii) N column codewords where M and N are integers greater than 0, and
    wherein the decoder, when decoding each of the plurality of interleaved component codewords along two dimensions, is configured to:
    decode each of the M row codewords to produce the set of first decoding results corresponding to each of the M rows of the array; and
    decode each of the N column codewords to produce the set of second decoding results corresponding to each of the N columns of the array.

13. The apparatus for decoding the codeword of claim 12, wherein the decoder, when detecting the short error event in the decoded interleaved component codewords based on (i) the set of first decoding results and (ii) the set of second decoding results, is configured to:
    determine whether at least one row codeword of the M row codewords has a non-zero syndrome weight based on the corresponding first decoding result; and
    in response to determining that at least one row codeword of the M row codewords has a non-zero syndrome weight based on the corresponding first decoding result, detect a near-codeword error event as the short error event in the decoded interleaved component codewords.

14. The apparatus for decoding the codeword of claim 13, wherein the decoder, when correcting the detected near-codeword error event based on (i) the set of first decoding results and (ii) the set of second decoding results, is configured to:
    identify, based on the corresponding second decoding result, at least one column codeword of the N column codewords having a non-zero syndrome weight;
    identify, based on the at least one column codeword having the non-zero syndrome weight, at least one bit location in the at least one row codeword having the non-zero syndrome weight;
    flip a bit located at the at least one identified bit location in the array; and
    decode the at least one row codeword with the flipped bit.

15. The apparatus for decoding the codeword of claim 12, wherein the decoder, when detecting the short error event in the decoded interleaved component codewords based on (i) the set of first decoding results and (ii) the set of second decoding results, is configured to:
    determine, based on the corresponding first decoding result, whether at least one row codeword of the M row codewords has a non-zero syndrome weight;
    in response to determining that none of the M row codewords have a non-zero syndrome weight based on the corresponding first decoding result, determine, based on the corresponding second decoding result, whether at least one column codeword of the N column codewords has a non-zero syndrome weight; and
    in response to determining that at least one column codeword of the N column codewords has a non-zero syndrome weight based on the corresponding second decoding result, detect a mis-correction error event as the short error event in the decoded interleaved component codewords.

16. The apparatus for decoding the codeword of claim 15, wherein the decoder, when correcting the detected mis-correction error event based on (i) the set of first decoding results and (ii) the set of second decoding results, is configured to:
    identify, based on the corresponding second decoding result, at least one column codeword of the N column codewords having a non-zero syndrome weight;
    flip a bit within each of the M row codewords at a location corresponding to the identified at least one column codeword; and
    iteratively decode the M row codewords including the flipped bit.

17. The apparatus for decoding the codeword of claim 16, wherein the decoder is further configured to:
    determine whether at least one row codeword of the M row codewords including the flipped bit produces a non-zero syndrome weight;
    in response to determining that at least one row codeword of the row codeword of the M row codewords including the flipped bit produces a non-zero syndrome weight, re-flip the flipped bit and re-decoding the at least one row codeword including the re-flipped bit.

18. The apparatus for decoding the codeword of claim 16, wherein the decoder is further configured to:
    re-decode the N column codewords including the flipped bit.

19. The apparatus for decoding the codeword of claim 11, wherein the decoder is further configured to:
    perform a cyclic redundancy check on the plurality of component codewords with the corrected short error event.

20. The apparatus for decoding the codeword of claim 11, wherein the N column codewords are of an interleaved single parity check (SPC) code and wherein the M row codewords are of an interleaved low-density parity check (LDPC) code.

* * * * *